United States Patent
Luning et al.

[11] Patent Number: 5,989,963
[45] Date of Patent: Nov. 23, 1999

[54] METHOD FOR OBTAINING A STEEP RETROGRADE CHANNEL PROFILE

[75] Inventors: Scott D. Luning, San Francisco, Calif.; David C. Greenlaw, Austin, Tex.; Jonathan Fewkes, San Jose, Calif.

[73] Assignee: Advanced Micro Devices, Inc., Sunnyvale, Calif.

[21] Appl. No.: 08/897,804

[22] Filed: Jul. 21, 1997

[51] Int. Cl.$^6$ .................................................. H01L 21/336
[52] U.S. Cl. .......................... 438/289; 438/162; 438/203; 438/290; 438/302
[58] Field of Search .................... 438/162, 166, 438/203, 289, 302, 778, 290

[56] References Cited

U.S. PATENT DOCUMENTS

| | | | |
|---|---|---|---|
| 4,463,493 | 8/1984 | Momose | 438/433 |
| 4,578,128 | 3/1986 | Mundt et al. | 438/433 |
| 4,965,648 | 10/1990 | Yang et al. | 257/240 |
| 5,079,177 | 1/1992 | Lage et al. | 438/203 |
| 5,264,394 | 11/1993 | Ruckman et al. | 438/778 |
| 5,266,510 | 11/1993 | Lee | 438/298 |
| 5,292,671 | 3/1994 | Odanaka | 438/433 |
| 5,409,848 | 4/1995 | Han et al. | 438/302 |
| 5,547,882 | 8/1996 | Juang et al. | 438/290 |
| 5,637,512 | 6/1997 | Miyasaka et al. | 438/166 |
| 5,656,844 | 8/1997 | Klein et al. | 257/347 |
| 5,770,485 | 6/1998 | Gardner et al. | 438/162 |
| 5,827,763 | 10/1998 | Gardner et al. | 438/232 |
| 5,864,163 | 1/1999 | Chou et al. | 257/385 |

FOREIGN PATENT DOCUMENTS

| | | |
|---|---|---|
| 407183393 | 7/1995 | Japan . |

OTHER PUBLICATIONS

"Re-examination of Indium implantation for a low power 0.1 um technology" IEDM 95–897 1995 IEEE P. Bouillon, et al.

"Indium Channel Implant for Improved Short-Channel Behavior of Submicrometer NMOSFETs" IEEE Electron Device Letters, vol. 14, NO. 8, Aug. 1993.

Primary Examiner—Peter Toby Brown
Assistant Examiner—Khanh Dvong
Attorney, Agent, or Firm—H. Donald Nelson

[57] ABSTRACT

A method of manufacturing a semiconductor device with a steep retrograde profile. The threshold voltage adjust dopant layer and the punchthrough prevent dopant layer are formed in the substrate. All surface capping layers are removed from the active device regions and, the semiconductor device is placed in a chamber and a high vacuum is established after which an inert atmosphere is introduced into the chamber. The anneal to repair the damage to the lattice and to activate the dopant ions in the dopant layers is done in the inert atmosphere with the surface of the substrate maintained clean, that is, free from a capping oxide or other layer formed on the surface of the substrate.

6 Claims, 5 Drawing Sheets

METHOD FOR OBTAINING A STEEP RETROGRADE CHANNEL PROFILE

BACKGROUND OF THE INVENTION

1. Field of the Invention

This invention relates generally to a method of manufacturing semiconductor devices and more specifically, this invention relates to a method of manufacturing advanced sub-half-micron logic and non-volatile integrated circuit semiconductor devices having steep retrograde channel profiles using conventional dopants.

2. Discussion of the Related Art

To achieve the higher performances that are required by the end users of semiconductors, semiconductor manufacturers must provide faster and more complicated circuits on semiconductor chips. In addition, end users of semiconductors have demanded more functions in a smaller chip area. This, for example, has resulted in the requirement to increase the density of transistors on chips in each new generation of semiconductors.

Two of the major goals of MOSFET scaling are to increase the density and the speed of the integrated circuits in which the scaled-down devices are to be used. To increase the density of integrated circuits, the physical dimensions of the integrated circuits have to be reduced, which requires smaller channel lengths and widths. To increase the speed of integrated circuits, there are several parametrics that must be addressed. For example, one such parametric that must be addressed is the MOSFET saturation drain current $I_{DSAT}$ that must be increased to allow faster charging and discharging of load and parasitic capacitances. The long-channel MOSFET models derived for the pre-submicron long-channel MOSFETs predicted that $I_{DSAT}$ should continue to increase with a decrease in either the channel length L or the gate oxide thickness $t_{ox}$. This seems to imply that only the limitations of process technology, i.e., not device effects, prevent the manufacture of smaller, higher-performing MOSFETs.

However, as process technology improved to the point where devices could be fabricated with gate lengths smaller than approximately 2 μm, MOSFETs began to exhibit phenomena not predicted by the long-channel MOSFET models. Such phenomena are called "short-channel effects." One such unpredicted phenomenon is the effect of gate dimensions on threshold voltage $V_T$. There are three basic short-channel effects on the threshold voltage of MOSFETs: (1) the short-channel threshold-voltage shift; (2) narrow gate width effects on threshold voltage; and (3) the reverse short-channel threshold voltage shift.

It has been found that as the channel length dimension L is reduced to less than 2 μm, the difference between the threshold voltage predicted by the long-channel models and the actual measured threshold voltage becomes significant. Typically, the threshold voltage decreases as L is reduced. However, in some situations it has been found that threshold voltage initially increases with decreasing channel length, beginning at about L=2–3 μm, contrary to what would be predicted. This phenomenon is called "reverse short channel effect" (RSCE), "$V_T$ roll-up," or "anomalous threshold behavior." After $V_T$ reaches a maximum value due to RSCE, at about 0.7 μm, $V_T$ declines as channel lengths are further decreased. This decline is called "$V_T$ roll-off." It is theorized that the two-dimensional effects that are responsible for $V_T$ roll-off eventually overcome the effects causing $V_T$ roll-up and dominate at the shorter channel lengths. In fact, another observed unexplained short channel phenomenon is that the rate of $V_T$ roll-off with shorter $L_{eff}$ (effective channel length) is much faster than can be explained by the conventional models of laterally uniform channel doping. There have been different explanations for the roll-up effect; however, while several of the models seem to provide good quantitative agreement with experimental observations of the reverse short-channel effect, a consensus has not been achieved as to the cause of the reverse short-channel effect.

As the channel lengths have continued to decrease and have been scaled to 0.25 μm and below, background and channel doping must be raised to values of $3 \times 10^{17}$ ions per $cm^2$ and higher in order to control the short-channel effects. This leads to reduced mobility and difficulty in obtaining a low threshold. To circumvent these problems, use of vertically, non-uniform channel profiles has been suggested and implemented. It has been shown that non-uniform channel doping results in better short-channel effects, that is, better $V_t$ roll-off characteristics and higher mobility. For best short-channel results, it is desirable to place the peak of the concentration profile as close to the surface as possible while still maintaining a low surface concentration. Because of the difficulty in obtaining a retrograde channel profile utilizing conventional manufacturing methods and conventional dopants, it has been proposed that alternative dopants be used to obtain and maintain the requisite non-uniform channel profile. One such proposal is the use of indium as a channel implant. The article "*Indium Channel Implant for Improved Short-Channel Behavior of Submicrometer NMOSFETs*" by G. G. Shahidi, Bijan Davari, Thomas J. Bucelot, P. A. Ronsheim, P. J. Coane, S. Pollack, C. R. Blair, B. Clark, and Howard H. Hansen, IEEE ELECTRON DEVICE LETTERS, VOL. 14, NO. 8, August 1993 discusses the benefits of using indium to achieve the desired channel profile and characteristics. The article "*Re-examination of Indium implantation for a low power 0.1 μm technology*," by P. Bouillon, F. Benistant, T. Skotnicki, G. Guegan, D. Roche, E. Andre, D. Mathiot, S. Tedesco, F. Martin, M. Heitzmann, M. Lerme, and M. Haond, IEDM 95-897, IEEE 1995 suggests that the use of Indium for the NMOS has remained a big concern for such issues as post-implant damage and room temperature freeze-out of the dopants. The latter article discusses a reduction in channel doping in order to enhance carrier mobility, and an increase in the dopant concentration close to half the junction depth in order to control punchthrough and that, in turn, calls for the use of a retrograde doping profile. The article also states that for deep sub-micron devices, conventional dopants can no longer be used to obtain these types of profiles.

Therefore, because of the problems associated with the proposed alternative dopants, what is needed is a method of manufacturing a sub-half-micron semiconductor device with steep retrograde channel profiles using conventional dopants such as boron, phosphorus and arsenic.

SUMMARY OF THE INVENTION

The present invention is directed to a method of manufacturing a semiconductor device with a steep retrograde channel doping profile. A screen oxide may be formed on the layer of a substrate and at least one dopant layer is formed in the substrate. The screen oxide or any other capping layer, if formed, is removed, the surface of the substrate is maintain in a clean condition and the substrate is annealed in a high purity inert atmosphere.

The substrate is placed in a chamber and a high vacuum is established after which a high purity inert gas is introduced into the chamber and the anneal process is accomplished by heating the interior of the chamber.

The vacuum established in the chamber is on the order of $10^{-5}$ torr.

The inert gas has a purity sufficient to prevent the formation of an oxide or other capping layer on the surface of the substrate.

The present invention is directed to a method wherein the inert gas has a purity on the order of 99.99%.

After the anneal process is completed, a high quality gate oxide or other dielectric is formed on the surface of the substrate.

The present invention is also directed to a method wherein the inert gas has a purity on the order of 99.999%.

The annealing process is carried out at a temperature in the range of 400–1000° C.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiments when read in conjunction with the accompanying drawings, wherein:

DETAILED DESCRIPTION

Reference is now made in detail to specific embodiments of the present invention which illustrate the best mode presently contemplated by the inventors for practicing the invention.

Figure 1:
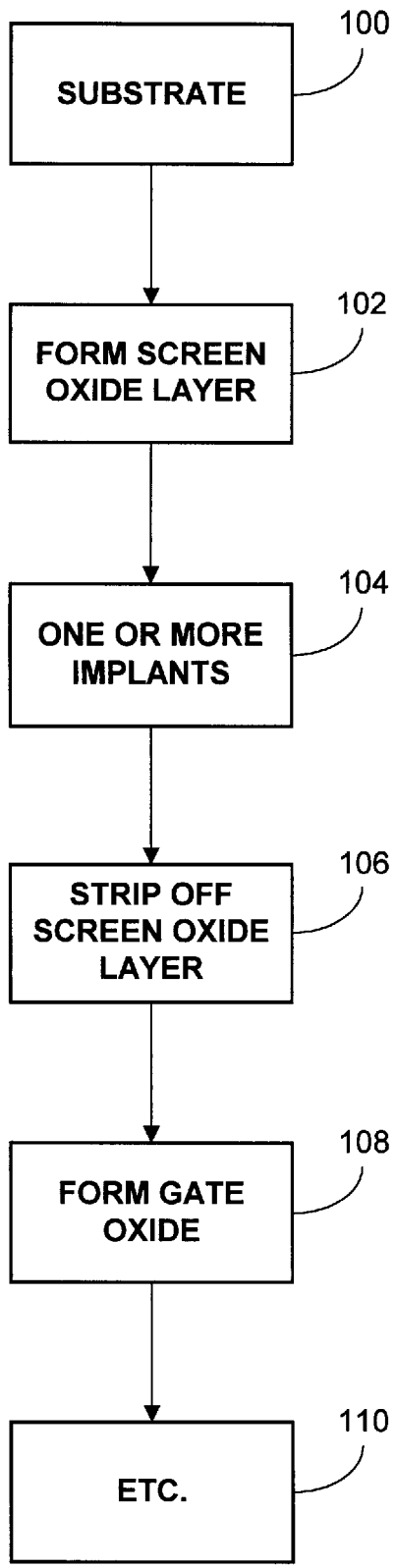
FIG. 1 is a flow diagram showing selected process steps in a prior art semiconductor manufacturing process.

FIG. 1 is a flow diagram showing selected steps in a prior art manufacturing process to manufacture a semiconductor device. The first step, indicated at 100, is to start with a substrate. A screen oxide layer, also known as a protective oxide layer or a barrier layer, is formed on the substrate in the next step, indicated at 102. One or more ion implant processes are performed on the substrate through the screen oxide layer at the next step, indicated at 104. After the one or more ion implant process, the screen oxide layer is removed, indicated at 106. After the screen oxide layer is removed, a high quality gate oxide is formed on the substrate, indicated at 108. The step, indicated at 110, represents the remaining process steps in the manufacture of the semiconductor device. The remaining steps of the manufacturing process will not be discussed.

Figure 2:
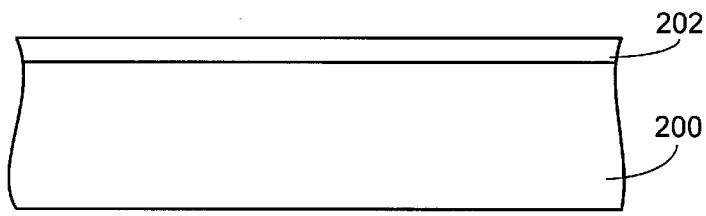
FIGS. 2 and 3A–5B show the form of the semiconductor device and related concentration profiles as they exist at each of the selected process steps as shown in the flow diagram of FIG. 1.

FIG. 2 shows a substrate 200 with a screen oxide layer 202 formed on the substrate 200. A typical manufacturing process is a CMOS technology in which wells are formed in the substrate for either an NMOS technology device or a PMOS technology device. The substrate 200 is typically a high resistivity substrate and for an NMOS technology process the substrate is a p-type high resistivity wafer and for a PMOS technology process; the substrate is an n-type high resistivity wafer. The screen oxide layer 202 is also known as a protective layer or a barrier layer and is formed to protect the surface of the substrate from contamination and for other purposes.

Figure 3A:
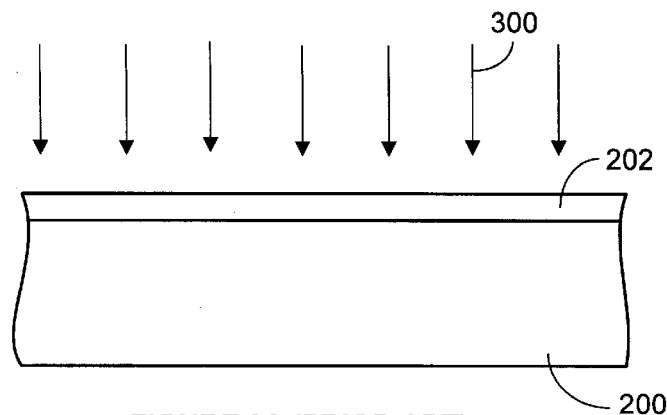
Figure 13:
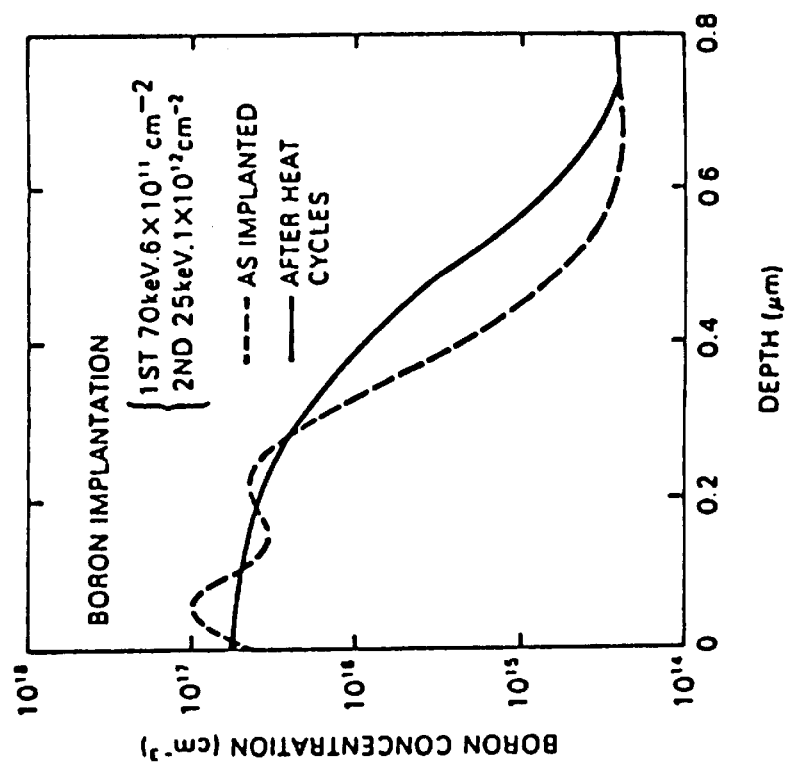
FIG. 13 shows the profiles of boron concentration as implanted and after heat cycles.
Figure 12:
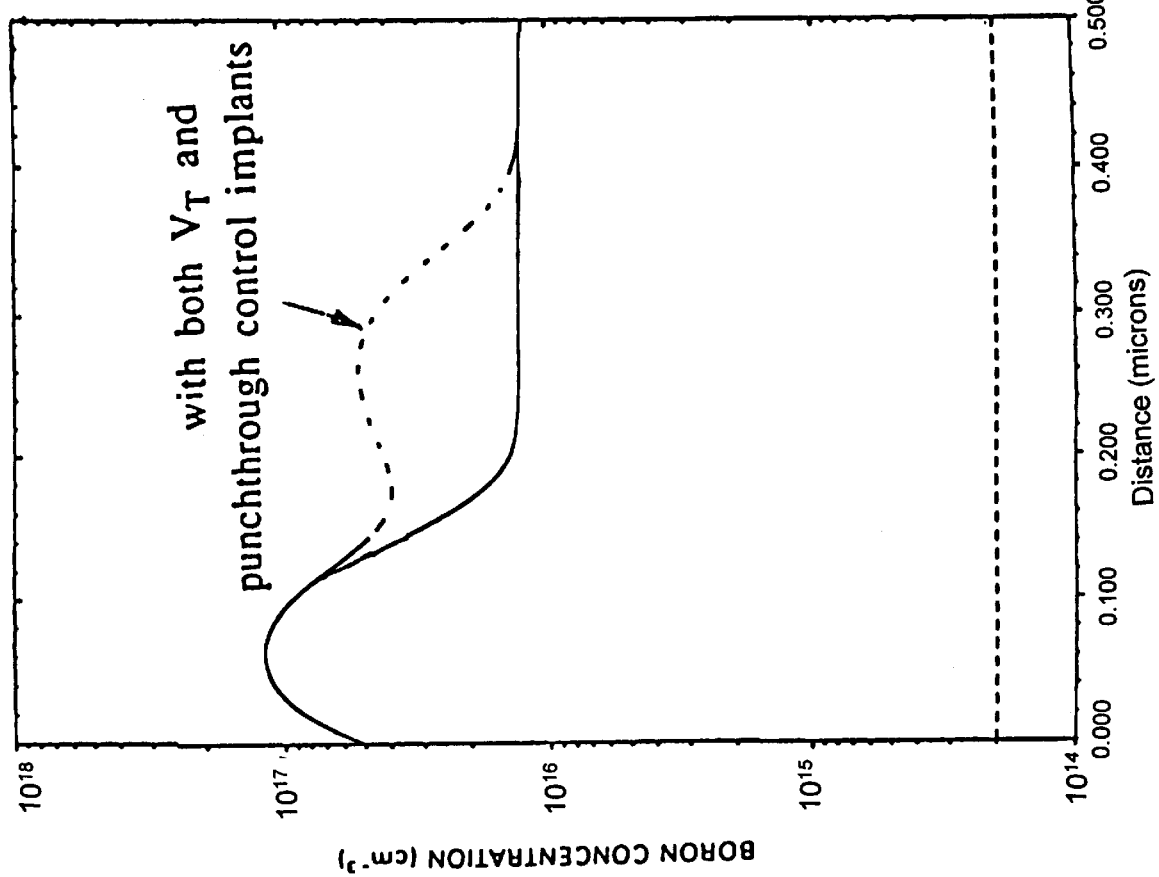
FIG. 12 shows the profiles of boron concentration with a threshold implant and with both threshold and punchthrough implants.

FIG. 3A illustrates the process of implanting one or more implants into the substrate 200 through the screen oxide 202, wherein the arrows 300 represent the ions being implanted. An implant that is typically implanted at this time is an ion implantation for adjusting the threshold voltage of the device. The technique of adjusting the threshold voltage involves the implantation of boron, phosphorus, or arsenic ions into the substrate. The implantation of boron ions causes a positive shift in the threshold voltage, while phosphorus or arsenic implantation causes a negative shift. Another of the implants that is typically implanted at this time is an ion implantation known as a punchthrough stopper implant or simply as a punchthrough implant. The punchthrough implant peak concentration is deeper than the threshold voltage adjust implant and is ideally located at a depth near the bottom of the source-drain regions in the semiconductor device. The additional doping introduced by the punchthrough implant, for example, boron in NMOSFETs, reduces the lateral widening of the drain-depletion region below the surface without increasing the doping under the junction regions. However, precise control of the placement and dose of this implant within the channel region is required to achieve the intended enhancements. For example, FIG. 12 shows the as-implanted doping profile of the channel with (dashed line) and without (solid line) a punchthrough implant. It is important to keep the punchthrough implant profiles from spreading out appreciably during annealing, since the additional doping above the substrate's value may add to the source/drain-to-substrate capacitance and the transistor's threshold voltage sensitivity to back biasing of the substrate. FIG. 13 shows the as-implanted doping profile of a first and second implant (dashed line) and the doping profile of the implant after heat cycles (solid line).

Figure 3B:
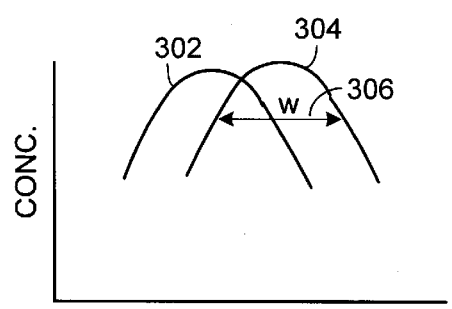

FIG. 3B shows the doping profiles of a first ion implant 302 and a second ion implant 304. As is known in the semiconductor manufacturing art, the ion implant process is typically done at a single implant energy. However, the resulting profile has a width w, indicated at 306, which indicates that some of the ions travel further into the substrate than other ions and depends partly upon details of the stopping process between individual implanted ions and substrate atoms.

Figure 4A:
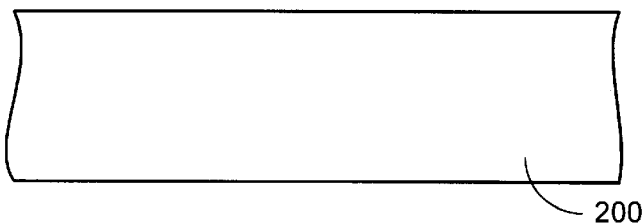
Figure 4B:
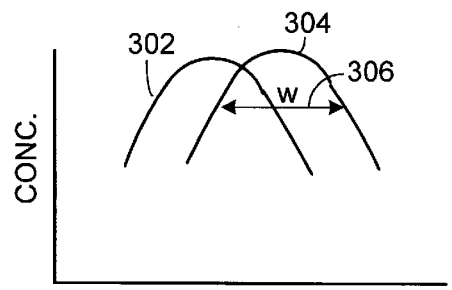

FIG. 4A shows the substrate with the screen oxide layer 202 removed. Since the removal of the screen oxide is not typically done at an elevated temperature, the doping profiles shown in FIG. 4B do not differ greatly from the doping profiles shown in FIG. 3B.

Figure 5A:
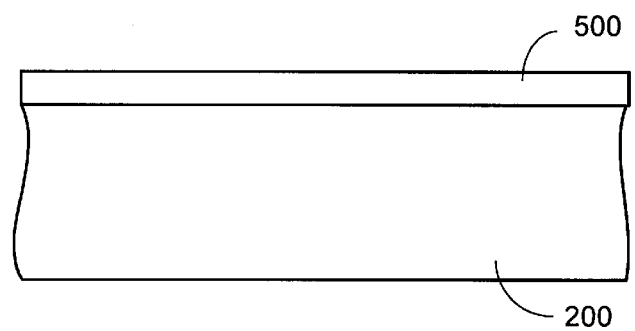
Figure 5B:
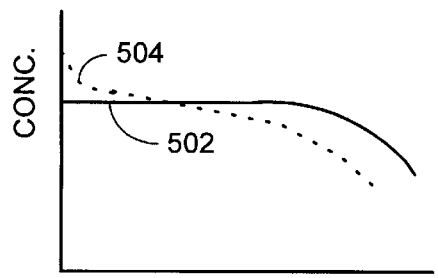

FIG. 5A shows the substrate 200 with a gate oxide layer 500 grown on the substrate 200. The gate oxide layer is a high quality oxide and is typically formed with a high temperature process that also serves the purpose of annealing and activating the implanted dopant ions. During an ion implantation process the ions are accelerated towards the surface of the substrate or, in this case, the screen oxide layer, and are caused to penetrate through the screen oxide layer and the surface of the substrate. This high energy penetration damages the substrate lattice. This damage to the substrate is removed by a high temperature anneal process. Because the formation of a high quality gate oxide layer can also be done using a high temperature, it is common to combine the anneal process and the gate oxide formation process. FIG. 5B shows the doping profile of the first and second implant after one or more high temperature processes. FIG. 5B shows that the concentration doping profile has become substantially flat near the surface of the substrate (solid line), indicated at 502. In some cases, FIG. 5B indicates that the doping concentration has become higher very near the surface of the substrate (dashed line) especially after subsequent source/drain processing, indicated at 504. The increase in the doping concentration near the surface of the substrate is partly due to the immediate capping of the substrate surface by the initial formation of a gate oxide or other capping layer during the anneal/gate oxide formation process. The initial capping of the substrate surface does not allow any of the dopant ions to escape or outgas from the substrate. The transient enhanced diffusion (TED) effect during the initial stages of the anneal process is a period in which a major portion of the diffusion occurs.

Figure 6:
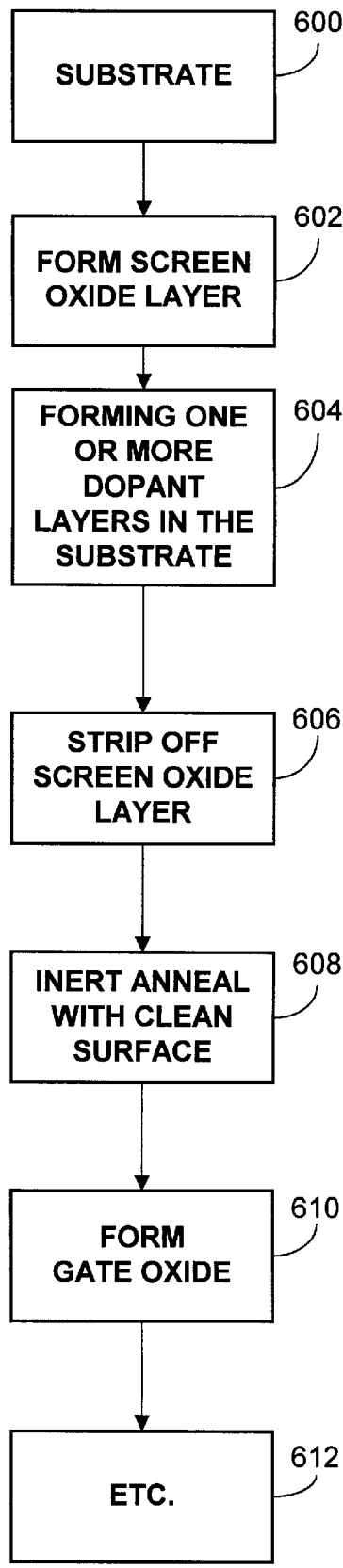
FIG. 6 is a flow diagram showing selected process steps in a semiconductor manufacturing process in accordance with the present invention.

FIG. 6 is a flow diagram showing selected steps in a manufacturing process to manufacture a semiconductor device in accordance with the present invention. The first step, indicated at 600, is to start with a substrate. A screen oxide layer, also known as a protective oxide layer or a barrier layer, is formed on the substrate in the next step, indicated at 602. One or more ion implant processes are performed on the substrate through the screen oxide layer at the next step, indicated at 604. After the one or more ion implant process, the screen oxide layer is removed, indicated at 606. An inert anneal process is performed which causes the surface of the substrate to remain clean, that is, free from any substantial formation of a capping layer or other type of layer formed on the surface, indicated at 608. After the inert anneal process is completed, a gate oxide layer is formed on the surface of the substrate, indicated at 610. The next step, indicated at 612, represents the remaining process steps to complete the manufacture of the semiconductor device. The remaining steps required to complete the manufacture of the semiconductor device are not discussed.

Figure 7:
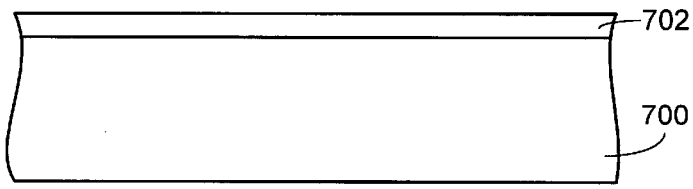
FIGS. 7 and 8A–11B show the form of the semiconductor device and related concentration profiles as they exist at each of the selected process steps as shown in the flow diagram of FIG. 6.

FIG. 7 shows a substrate 700 with a screen oxide layer 702 formed on the substrate 700. The substrate 700 is typically a high resistivity substrate and for an NMOS technology process the substrate is a p-type high resistivity wafer and for a PMOS technology process the substrate is an n-type high resistivity wafer. As is known in the semiconductor manufacturing art, in a CMOS technology, an NMOS device may be formed in a p-type well which is formed in an n-type substrate. A PMOS device may be formed in an n-type well which is formed in a p-type substrate. The above processes depend upon what type of substrate is being used. The screen oxide layer 702 is also known as a protective layer or a barrier layer and is formed to protect the surface of the substrate from contamination and for other reasons such as to modify implant characteristics to make them more controllable.

Figure 8A:
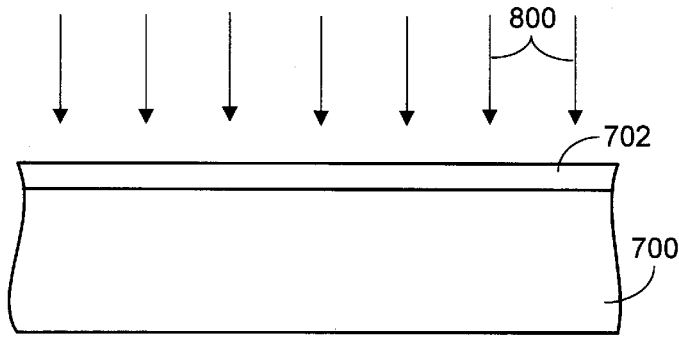

FIG. 8A illustrates the process of forming a dopant layer in the substrate by implanting one or more implants into the substrate 700 through the screen oxide 702, wherein the arrows 800 represent the ions being implanted. The forming of dopant layers in the substrate is described using ion implantation. It is to be understood that other methods of forming dopant layers in the substrate, such as a diffusion process, is comprehended by this invention. One of the dopant layers that is formed is a dopant layer for adjusting the threshold voltage of the device. The technique of adjusting the threshold voltage involves the forming of a dopant layer of boron, phosphorus, or arsenic ions in the substrate. The technique of adjusting the threshold voltage by implantation involves the implantation of boron, phosphorus, or arsenic ions into substrate. The boron ions cause a positive shift in the threshold voltage, while phosphorus or arsenic ions cause a negative shift. Another of the dopant layers that is typically formed at this time is a punchthrough stopper layer also known simply as a punchthrough layer. The punchthrough dopant layer peak concentration is ideally located at a depth near the bottom of the source-drain regions in the final semiconductor device. The additional doping introduced by the punchthrough dopant layer, for example, boron in NMOSFETs, reduces the lateral widening of the drain-depletion region below the surface without unduly increasing the doping under the junction regions. However, precise control of the placement and dose of this implant within the channel region is required to achieve the intended enhancements. For example, FIG. 12 shows the as-implanted doping profile of the channel with (dashed line) and without (solid line) a punchthrough implant. It is important to keep the punchthrough implant profiles from spreading out appreciably during annealing, since the additional doping above the substrates value adds to the source/drain-to-substrate capacitance and the transistor's threshold voltage sensitivity to back biasing of the substrate. FIG. 13 shows the as-implanted doping profile of a first and second implant (dashed line) and the doping profile of the implant after heat cycles (solid line).

Figure 8B:
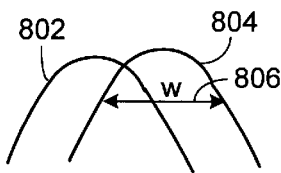

FIG. 8B shows the doping profiles of a first ion implant 802 and a second ion implant 804. As is known in the semiconductor manufacturing art, the ion implant process is typically done at a single implant energy. However, the resulting profile has a width w, indicated at 806, which indicates that some of the ions travel further into the substrate than other ions and depends partly upon details of the stopping process between individual implanted ions and the substrate atoms.

Figure 9A:
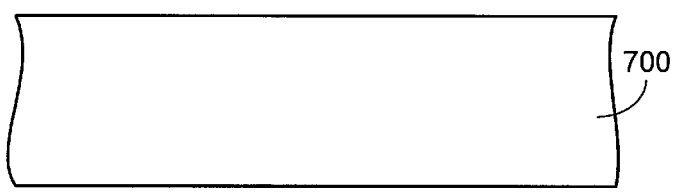
Figure 9B:
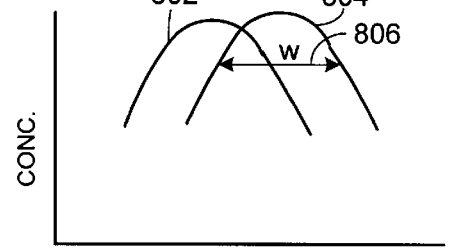

FIG. 9A shows the substrate 700 with the screen oxide layer 702 removed. Since the removal of the screen oxide is not typically done at an elevated temperature, the doping profiles shown in FIG. 9B do not differ greatly from the doping profiles shown in FIG. 8B.

Figure 10A:

FIG. 10A shows the substrate 700 undergoing an annealing process at a high temperature, typically in the range of 400–1000° C. The annealing process is to repair the damage to the substrate lattice caused by the ion implantation process and to activate the implanted dopant ions. The damage to the substrate lattice is caused by the dopant ions being accelerated towards the surface of the substrate or, in this case, the screen oxide layer, and which are caused to penetrate through the screen oxide layer and the surface of the substrate. This high-energy penetration damages the substrate lattice that must be repaired for proper operation of the semiconductor device. In order to obtain a steep retrograde concentration profile, the anneal process is conducted in an inert atmosphere. The inert atmosphere is to prevent any oxide forming on the surface of the substrate during the anneal process. The anneal process is conducted by purging the chamber in which the process is being performed by applying a high vacuum on the order of $10^{-5}$ torr to the chamber and introducing an ambient atmosphere made up of an inert gas such as argon (Ar) or nitrogen (N). The purity of the atmosphere is on the order of 99.99% or 99.999% pure. The anneal process is conducted in an inert atmosphere that prevents an oxide from forming on the surface of the substrate. Because there is no capping oxide layer formed on the substrate, the clean substrate surface allows dopant ions near the surface to out-diffuse from the substrate. As is known in the semiconductor art, there is an initial period during dopant activation or anneal periods immediately following ion implantation that is termed TED (transient enhanced diffusion). The TED is an initial period of rapid diffusion in which a majority of the diffusion takes place. The TED is characterized by a relatively large movement of dopant ions. It is theorized that the TED period is caused because the damage to the substrate lattice allows a large movement of dopant ions. The amount of diffusion taking place during the TED period diminishes as the damage to the lattice is repaired by the anneal process.

Figure 10B:
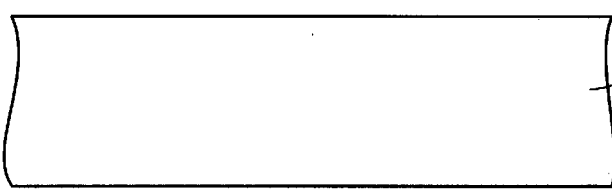

FIG. 10B shows a concentration profile of the dopant ions immediately after the anneal process and shows that there is a steep retrograde profile. As is known in the semiconductor manufacturing art, a retrograde profile is a profile that is low close to the substrate surface and increases as the depth into the substrate increases.

Figure 11A:
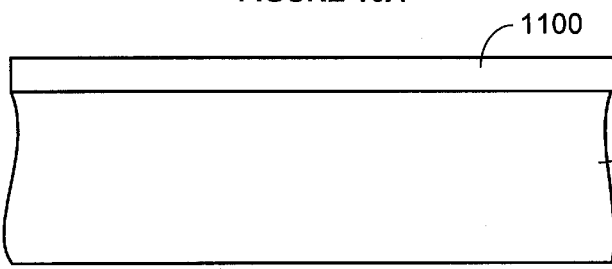
Figure 11B:
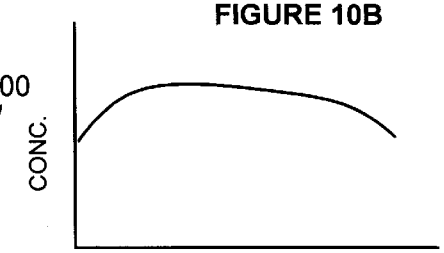

FIG. 11A shows the substrate 700 with a gate oxide layer 1100 formed on the substrate 700. The gate oxide layer is a high quality oxide and is typically formed with a high temperature process. FIG. 11B shows the concentration profile and shows that the high temperature process to form the gate oxide layer 1100 has flattened the concentration profile from the steepness achieved as shown in FIG. 10B. However, the retrograde profile is much steeper than that shown in the prior art processes.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of manufacturing a semiconductor device with a retrograde channel profile, the method comprising:

forming a substrate;

forming a first dopant layer beneath a surface of the substrate;

forming the retrograde channel profile by annealing the substrate and preventing a capping layer from forming on the surface of the substrate by annealing the substrate in an inert gas having a purity on the order of 99.99%;

forming at least a second dopant layer in the substrate;

placing the substrate into a chamber;

establishing a vacuum on the order of $10^{-5}$ torr in the chamber;

introducing the inert gas into the chamber; and heating the chamber to a temperature in the range of 400–1000° C.

2. The method of claim 1, further comprising forming a dielectric layer on the substrate after the annealing process is completed.

3. The method of claim 1, wherein forming at least one dopant layer is accomplished by implanting selected dopant ions into the substrate.

4. The method of claim 2, wherein the inert gas is chosen from the group of argon and nitrogen.

5. The method of claim 3, wherein forming at least a second dopant layer is accomplished by implanting selected dopant ions into the substrate. on the substrate after the annealing process is completed.

6. The method of claim 4, wherein the inert gas has purity on the order of 99.999%.

* * * * *